United States Patent
Lai et al.

(10) Patent No.: US 7,489,513 B2
(45) Date of Patent: Feb. 10, 2009

(54) HEAT DISSIPATION DEVICE

(75) Inventors: Cheng-Tien Lai, Taipei Hsien (TW);
Zhi-Yong Zhou, Shenzhen (CN);
Cui-Jun Lu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/684,457

(22) Filed: Mar. 9, 2007

(65) Prior Publication Data
US 2007/0279872 A1     Dec. 6, 2007

(30) Foreign Application Priority Data
Jun. 2, 2006    (CN) .................. 2006 1 0060942

(51) Int. Cl.
*H05K 7/20* (2006.01)
*H02M 7/48* (2007.01)

(52) U.S. Cl. ............... 361/710; 361/703; 361/707; 165/80.3; 165/104.33; 165/185

(58) Field of Classification Search ........... 361/687, 361/690–697, 702–712; 165/80.2, 80.3, 165/80.4, 104.33, 104.34, 185; 257/706–727; 29/890.03
See application file for complete search history.

(56) References Cited

U.S. PATENT DOCUMENTS

| | | | | |
|---|---|---|---|---|
| 2,965,819 A * | 12/1960 | Rosenbaum | ............... | 257/722 |
| 3,312,277 A * | 4/1967 | Chitouras et al. | ........... | 165/185 |
| 5,042,257 A * | 8/1991 | Kendrick et al. | ............... | 62/3.1 |
| 5,304,846 A | 4/1994 | Azar et al. | | |
| 5,838,065 A * | 11/1998 | Hamburgen et al. | ........ | 257/722 |
| 5,912,802 A * | 6/1999 | Nelson | ....................... | 361/695 |
| 5,937,517 A * | 8/1999 | Smith et al. | ............... | 29/890.03 |
| 6,000,938 A * | 12/1999 | Melanowicz | ................ | 432/250 |
| 6,076,594 A * | 6/2000 | Kuo | ........................... | 165/80.3 |
| 6,279,647 B1 * | 8/2001 | Karlsson et al. | ................ | 165/9 |
| 6,352,104 B1 * | 3/2002 | Mok | ......................... | 165/80.3 |
| 6,396,693 B1 * | 5/2002 | Shih | .......................... | 361/703 |
| 6,604,575 B1 * | 8/2003 | Degtiarenko | ................ | 165/185 |
| 6,906,922 B2 * | 6/2005 | Yu et al. | ..................... | 361/697 |
| 6,958,914 B2 * | 10/2005 | Hoss | .......................... | 361/704 |
| 7,209,349 B2 * | 4/2007 | Chien et al. | ................. | 361/687 |
| 7,251,134 B2 * | 7/2007 | Liu et al. | ..................... | 361/695 |
| 2005/0286232 A1* | 12/2005 | Chen et al. | ................... | 361/710 |

FOREIGN PATENT DOCUMENTS

CN          2517017 Y        10/2002
JP       02004056846 A  *    2/2004

* cited by examiner

*Primary Examiner*—Michael V Datskovskiy
(74) *Attorney, Agent, or Firm*—Frank R. Niranjan

(57) ABSTRACT

A heat dissipation device includes a first heat sink and a second heat sink juxtaposed with the first heat sink. The first heat sink includes a first base and a plurality of first fin extending from the first base with a plurality of first channels defined therebetween. The second heat sink includes a second base and a plurality of second fins extending from the second base with a plurality of second channels defined therebetween. The second fins extend beyond a common edge of the first base and the second base to extend into first channels of the first heat sink.

20 Claims, 8 Drawing Sheets

HEAT DISSIPATION DEVICE

BACKGROUND OF THE INVENTION

1. Field of the Invention

The present invention relates to a heat dissipation device for removing heat from a heat-generating device, and particularly to a heat dissipation device having a high fin density.

2. Description of Related Art

As computer technology continues to advance, electronic components such as central processing units (CPUs) are being made to provide faster operational speeds and greater functional capabilities. When a CPU operates at high speed its temperature usually increases enormously. It is therefore desirable to dissipate the generated heat of the CPU quickly before damage occurs.

A heat dissipation device 10 in accordance with the related art is shown in FIG. 8. The heat dissipation device 10 is made of aluminum extrusion and includes a flat base 20 and a plurality of parallel fins 30 perpendicularly extending from a top surface of the base 20. In order to increase the heat dissipation area, the heat dissipation device 10 is generally designed to have a high fin density. However, because of manufacturing limitations of aluminum extrusion, there is a limitation to the fin density.

What is needed, therefore, is a heat dissipation device, which can overcome the above-described limitation regarding fin density of fins of a heat sink made of aluminum extrusion.

SUMMARY OF THE INVENTION

A heat dissipation device comprises a first heat sink and a second heat sink juxtaposed with the first heat sink. Both the first and second heat sinks are made of aluminum extrusion. The first heat sink comprises a first base and a plurality of first fins extending from the first base with a plurality of first channels defined therebetween. The second heat sink comprises a second base and a plurality of second fins extending from the second base with a plurality of second channels defined therebetween. The second fins extend beyond a common edge of the first base and the second base to extend into first channels of the first heat sink.

Other advantages and novel features will become more apparent from the following detailed description of preferred embodiments when taken in conjunction with the accompanying drawings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
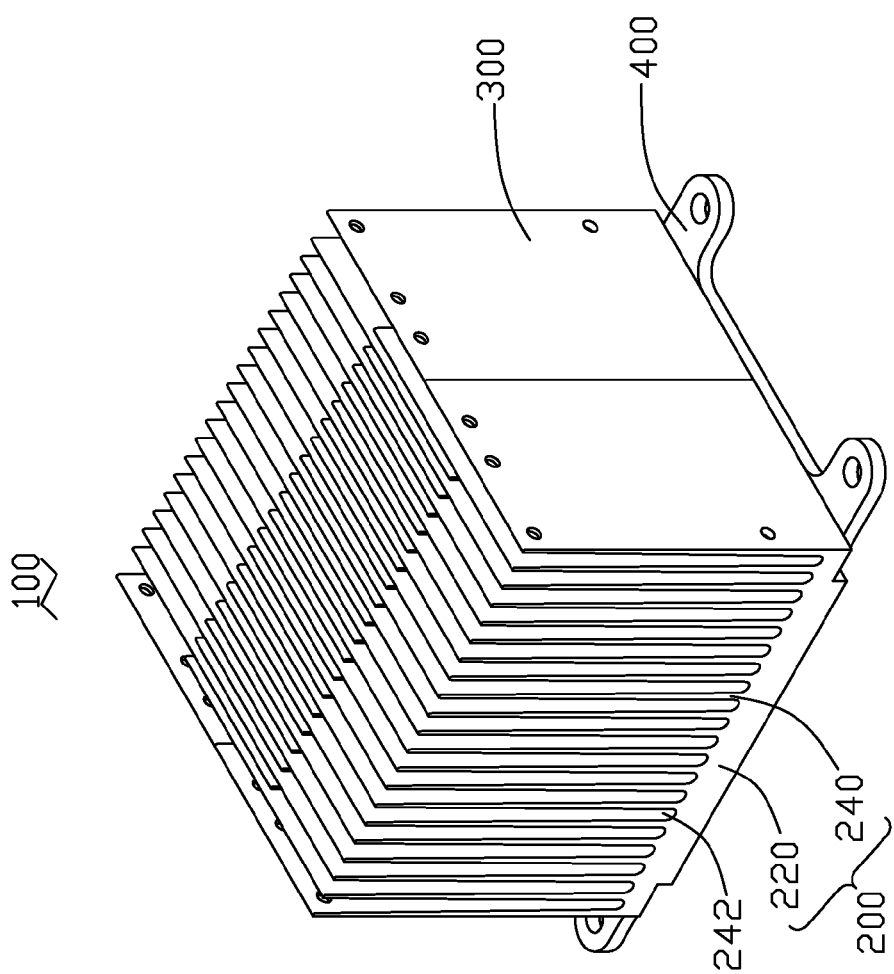
FIG. 1 is an isometric view of a heat dissipation device in accordance with a first preferred embodiment of the present invention.
Figure 2:
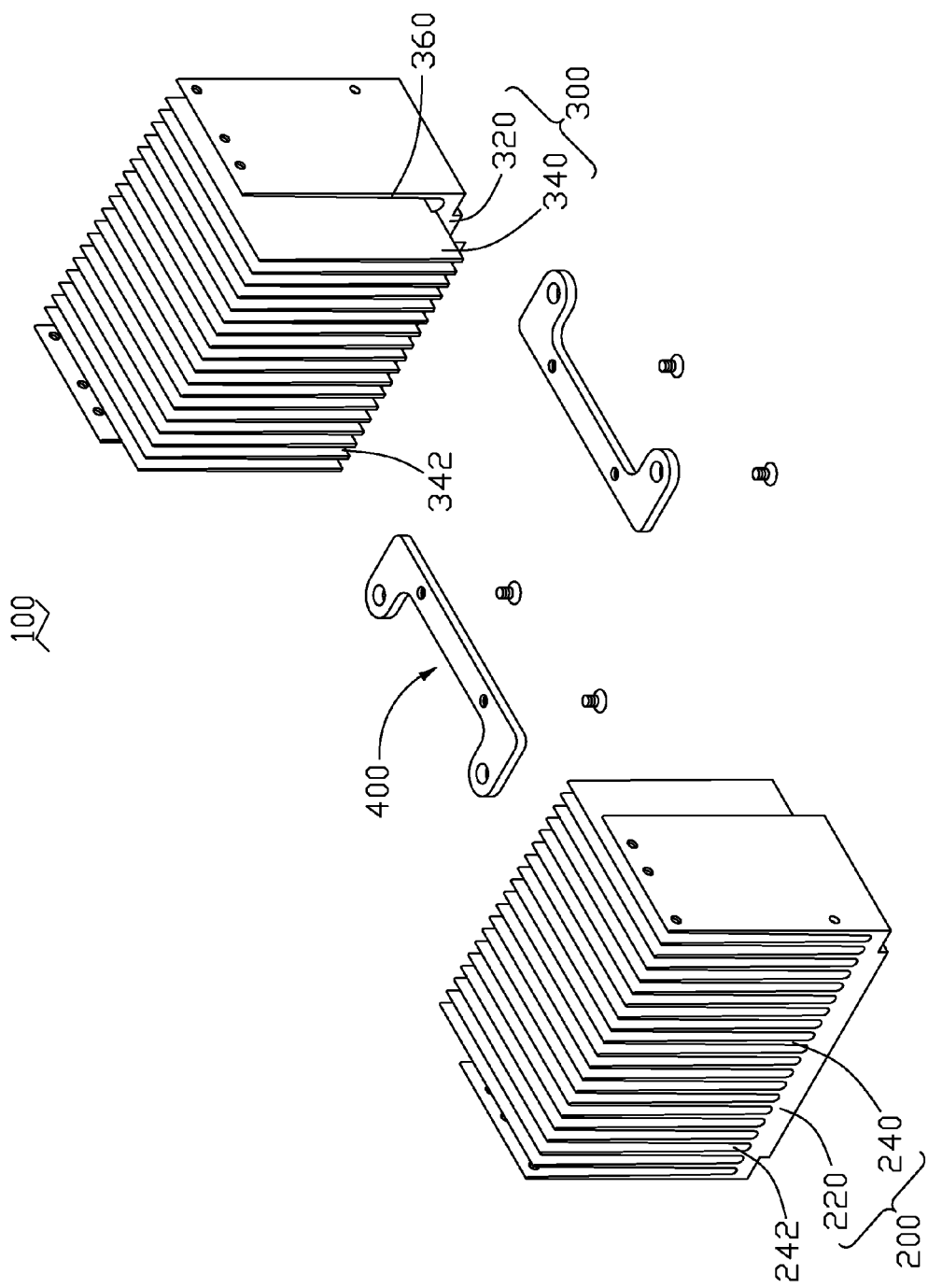
FIG. 2 is an exploded view of the heat dissipation device in FIG. 1.
Figure 3:
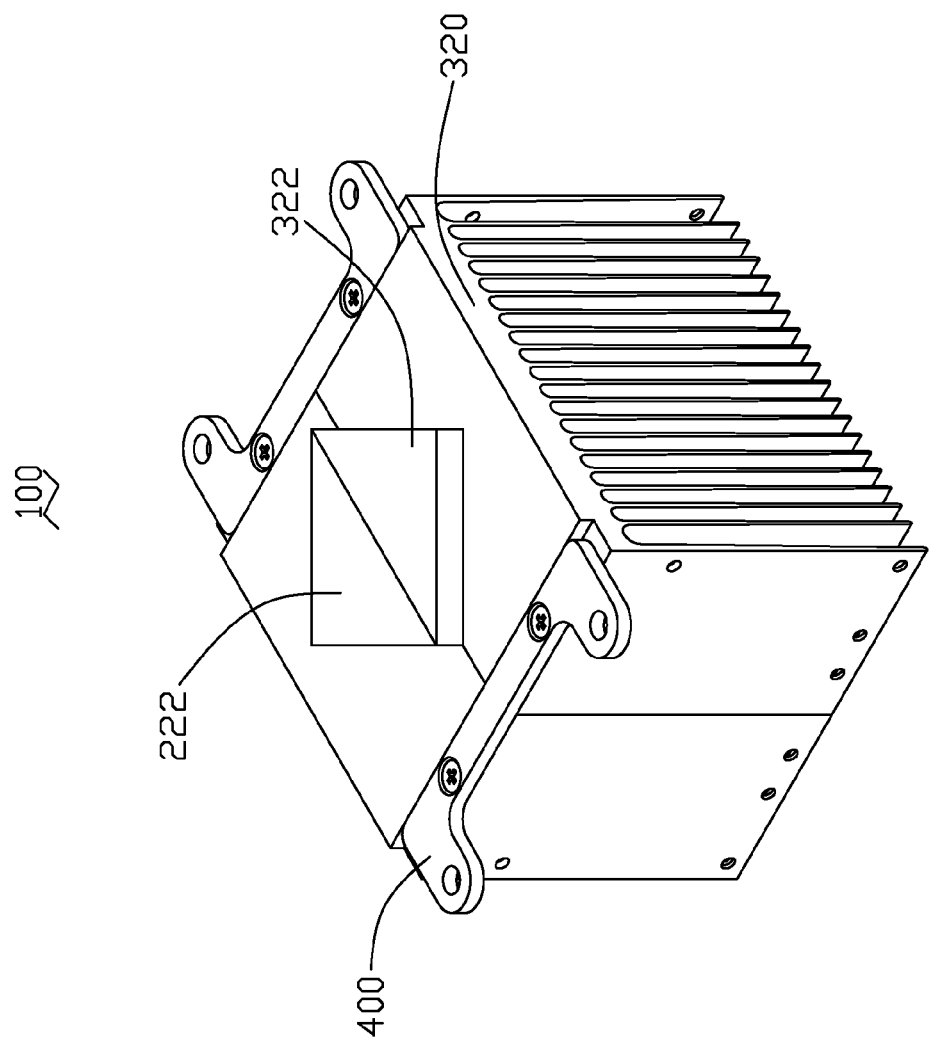
FIG. 3 is an isometric view of the heat dissipation device in FIG. 1 viewed from another aspect.
Figure 4:
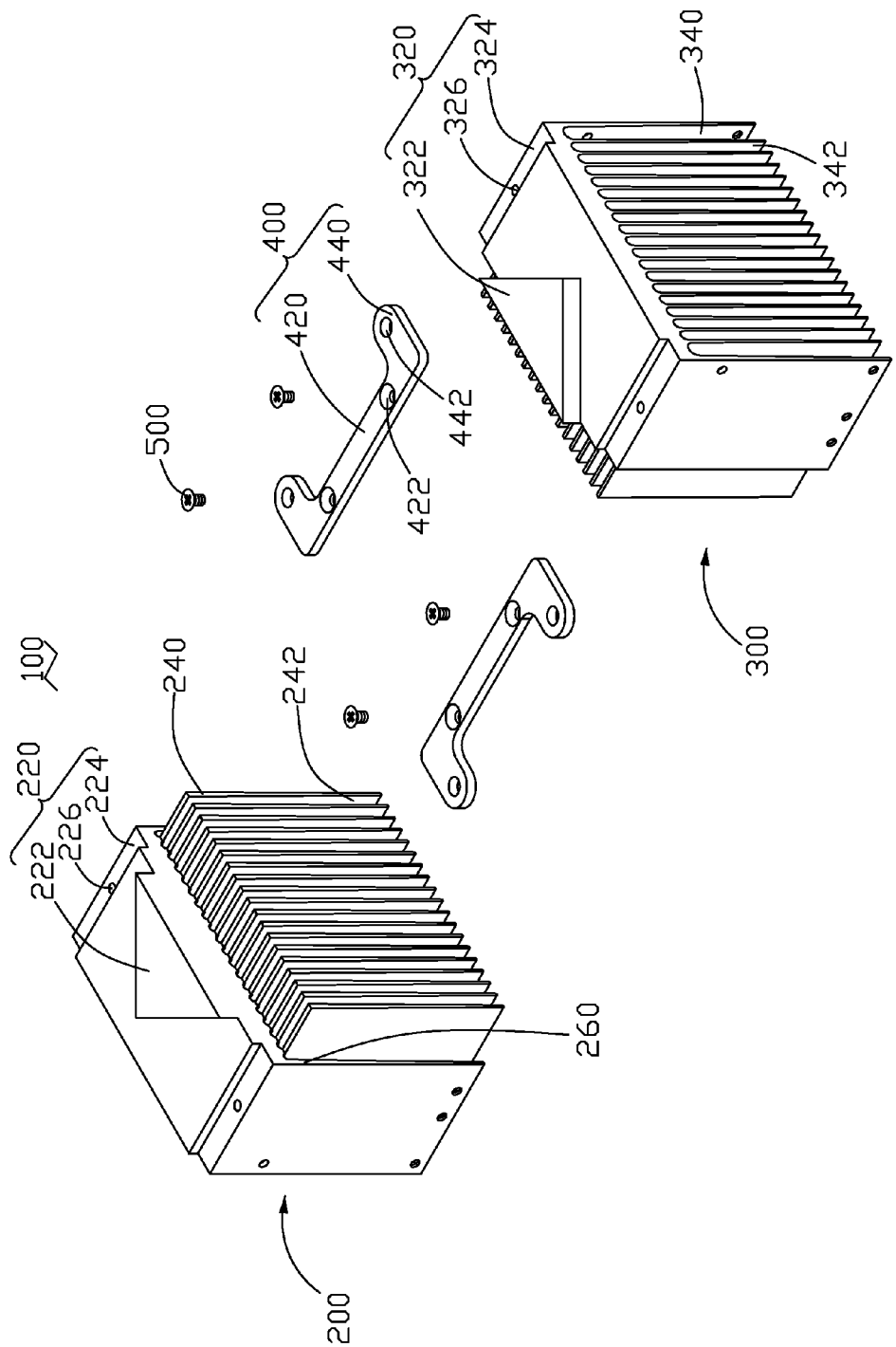
FIG. 4 is an exploded view of the heat dissipation device in FIG. 3.

Referring to FIGS. 1-4, a heat dissipation device 100 in accordance with a preferred embodiment of the present invention is illustrated. The heat dissipation device 100 generally comprises a first heat sink 200, a second heat sink 300 juxtaposed with the first heat sink 200, and a fastening member, such as two clips 400 for fastening the second heat sink 300 to the first heat sink 200.

The first heat sink 200 is made of a metal, such as aluminum, and generally comprises a flat first base 220 and a plurality of first fins 240 integrally formed with the first base 220. Preferably, the first heat sink 200 is formed by aluminum extrusion.

The first base 220 has a rectangular outer configuration, and a triangular protrusion 222 extending from a middle portion of the first base 220 at a rear edge thereof. Two recesses 224 are transversely formed at opposite lateral sides of the first base 220, each having a threaded hole 226 defined therein to receive a screw 500 so as to fasten the clip 400 to a bottom surface of the first base 220.

On a top surface of the first base 220, the first fins 240 are arranged in parallel at a predetermined interval. The first fins 240 extend upwardly and perpendicularly from the first base 220 with a plurality of first channels 242 formed between the first fins 240. When viewed from another aspect, the first fins 240 extend from a front end of the first base 220 towards a rear end of the first base 220. The first fins 240 transversely overlap the first base 220 and extend beyond the first base 220. In other words, the first fins 240 transversely extend from the front end of the first base 220 to a place beyond the rear end of the first base 220 to extend into the second heat sink 300.

The second heat sink 300 has a structure similar to that of the first heat sink 200 in this embodiment. The second heat sink 300 comprises a flat second base 320 and a plurality of second fins 340 integrally formed with the second base 320. Preferably, the second heat sink 300 is formed by aluminum extrusion.

The second base 320 has a rectangular outer configuration, and a second triangular protrusion 322 extending from a middle portion of the second base 320 at a front edge thereof. Two second recesses 324 are transversely formed at opposite lateral sides of the second base 320, each having a threaded hole 326 defined therein. The threaded holes 326 serve to engage with the screws 500 so as to screw the clips 400 to the second base 320.

The second fins 340 extend upwardly and perpendicularly from the second base 320 with a plurality of second channels 342 formed therebetween when viewed from a vertical direction. When viewed from a horizontal direction, the second fins 340 transversely extend from a rear end of the second base 320 towards a front end of the second base 320, more particularly, extend beyond the front end of the second base 320 to extend into the first heat sink 200.

Furthermore, the second fins 340 are so arranged on a top surface of the second base 320 that the second fins 340 respectively align with the first channels 242, while the second channels 342 respectively align with the first fins 240 when the first heat sink 200 is juxtaposed with the second heat sink 300. In other words, the first fins 240 and the second fins 340 are so arranged that they can be pushed into the first channels 242 and the second channels 342, respectively, prior to the first heat sink 200 and the second heat sink 300 being clipped together via the clips 400.

The clips 400 are disposed on and supported by the first recesses 224 and the second recesses 324 when the first base 220 and the second base 320 directly abut each other at a same elevation. That is, after the first heat sink 200 is arranged side-by-side with the second heat sink 300, the clips 400 span across a common edge of the first base 220 and the second base 320, and fasten the first heat sink 200 to the second heat sink 300. The detailed structure of the clips 400 will be described in the following text.

The clips 400 each comprises a body 420 with two spaced through holes 422 defined therein, and two arms 440 perpendicularly extending from opposite ends of the body 420. The two through holes 422 of each clip 400 respectively align with an associated first threaded hole 226 and an associated second threaded hole 326 disposed at a common side of the heat dissipation device 100. Each arm 440 of the clips 400 has an aperture 442 defined therein. The aperture 442 is provided for a locking member (not shown) extending therethough to secure the heat dissipation device 100 onto a heat generating component (not shown).

Therefore, the clips 400 have two main functions, to secure the heat dissipation device 100 onto the heat generating component, and to fasten the first heat sink 200 to the second heat sink 300. The assembly process of the heat dissipation device 100 will be described in the following text.

First, the first heat sink 200 and the second heat sink 300 are arranged side-by-side with each other in such a manner that the first base 220 and the second base 320 are positioned at a same elevation.

Then, the first heat sink 200 and the second heat sink 300 are pushed towards each other until the first base 220 abuts against the second base 320 at a same elevation, so that the first fins 240 are respectively parallelly inserted into the second channels 342 from the front end of the second heat sink 300. Simultaneously, the second fins 340 are also respectively parallelly inserted into the first channels 242 of the first heat sink 200.

As a result, the first protrusion 222 and the second protrusion 322 abut against each other to form a rectangular heat absorbing block for the heat dissipation device 100. The first recesses 224 and the second recesses 324 together form two elongated steps at opposite lateral sides of the heat dissipation device 100 to receive the clips 400.

Finally, the clips 400 are respectively positioned at the steps, and the screws 500 are extended through the associated holes 422 of the clips 400 to engage into the associated threaded holes 226, 326. Therefore, the first heat sink 200 and the second heat sink 300 are assembled together via the clips 400, and the heat dissipation device 100 is formed.

For precise alignment of the first heat sink 200 with respect to the second heat sink 300, the first and last first fins 240 of the first heat sink 200 are relatively shorter than the other first fins 240 along a direction from the front end to the rear end of the first heat sink 200. The first and last first fins 240 of the first heat sink 200 each have a first position surface 260 facing to the second heat sink 300. Similar, the first and last second fins 340 of the second heat sink 300 each have a second positioning surface 360 opposing to the first positioning surface 260. During assembly process of the heat dissipation device 100, the first positioning surfaces 260 of the first heat sink 200, are aligned to the associated second positioning surfaces 360 of the second heat sink 300.

As mentioned above, after the first heat sink 200 and the second heat sink 300 are assembled together, the first heat sink 200 and the second heat sink 300 have the common edge, particularly a U-shaped common edge formed therebetween. Each first fin 240 spans across the common edge and extends into an associated second channel 342; as a result, each first fin 240 divides the associated second channel 342 into two airflow channels. Similar, each second fin 340 also divides an associated first channel 240 into two airflows channels. Thus, the gap of the airflow channel between two adjacent fins, particularly a first fin 240 and a neighboring second fin 340, has been great reduced to one half of the original interval between two adjacent second fins 340, or two adjacent first fins 240. Since the gap between two adjacent fins 240, 340 are greatly reduced, the fin density of the heat dissipation device 100 is improved.

Figure 5:
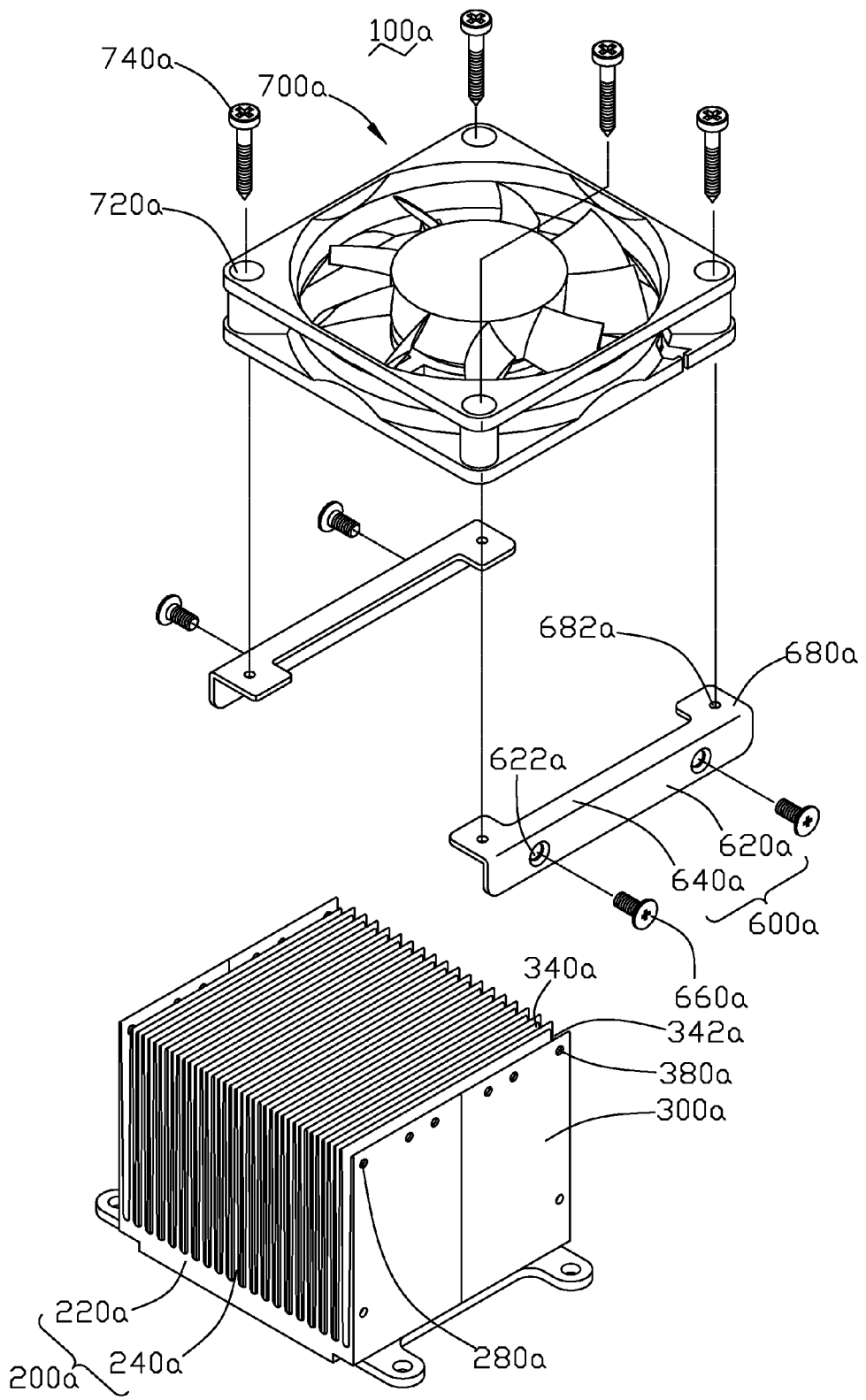
FIG. 5 is a partly exploded view of a heat dissipation device in accordance with a second preferred embodiment of the present invention.

In this embodiment, the first fins 240 transversely extend in the second channels 342 for a distance shorter than a width of the second base 320, that is a distance from the front end to the rear end of the second base 320. Similarly, the second fins 340 transversely extend in the first channels 242 for a distance shorter than a width of the first base 220, that is a distance from the front end to the rear end of the first base 220. This serves to disturb the air flowing past the first and second fins 240, 340, thereby improving the heat exchanging efficiency. However, in another embodiment as shown in FIG. 5, the first fins 240a are designed to extend in the second channels 342a for a distance just equal to a width of the second base. Similarly, the second fins 340a are designed to extend in the first channels for a distance just equal to a width of the first base 220a.

Furthermore, since the first heat sink 200 and the second heat sink 300 are formed by aluminum extrusion, which has a low cost, the heat dissipation device 100 provides a high fin density with low cost. Additionally, since the first fins 240 and the second fins 340 are respectively integrally formed with the first base 220 and the second base 320, the resistance between the fins 240, 340 and the associated base 220, 320 is relatively small. This serves to further improve the heat dissipating efficiency of the heat dissipation device 100.

Moreover, since the clips 400 are fastened to the heat dissipation device 100 via screws 500, the clips 400 are easily removed or disengaged from the heat dissipation device 100. As a result, the first heat sink 200 and the second heat sink 300 are easily separated from each other. Therefore, a first heat sink may engage with different second heat sinks with different fin density.

As described above, the first heat sink 200 and the second heat sink 300 are connected together via the clips 400. In order to ensure that the first heat sink 200 and the second heat sink 300 are firmly assembled, two fixing members 600a are provided in another embodiment as shown in FIG. 5. In this embodiment, there are several threaded holes 280a, 380a formed at top edges of the first heat sink 200a and the second heat sink 300a, for engaging with the fixing members 600a.

Each fixing member 600a has a first plate 620a with a pair of spaced first fixing holes 622a defined therein. The fixing members 600a are mounted on opposite sides of the heat dissipation device 100a. At each lateral side, the first holes 622a of the fixing member 600a respectively align with the threaded holes 280a, 380a disposed at a common lateral side of the heat dissipation device 100a. Therefore, the fixing member 600a can be detachably mounted on the heat dissipation device 100a via screws 660a extending through the corresponding fixing holes 622a and the threaded holes 280a, 380a. In other words, at each lateral side of the heat dissipation device 100a, the fixing member 600a transversely spans across the first heat sink 200a and the second heat sink 300a, and connects the first heat sink 200a to the second heat sink 300a via screws 660a. The engagement between the fixing members 600a and the threaded holes 280a, 380a serves to firmly assemble the first heat sink 200a and the second heat sink 300a together.

In addition to being secondary clips to reinforce the heat dissipation device 100a, the fixing members 600a can also be used to mount a fan 700a on a top portion of the heat dissipation device 100a. As shown in FIG. 5, the fan 700a has four mounting holes 720a in four corners thereof respectively, and each fixing member 600a further comprises a second plate 640a supporting the fan 700a. The second plate 640a integrally extends perpendicularly inwardly from a top edge of the first plate 620a. An ear 680a extends coplanarly inwardly from each of the opposite ends of the second plate 640a. A second fixing hole 682a is defined in each ear 680a of the second plate 640a, corresponding to one of the mounting holes 720a of the fan 700a. The fan 700a is secured on the fixing member 600a via screws 740a extending through the mounting holes 720a of the fan 700a to engage into the second fixing holes 682a of the ears 680a of the second plates 640a. The fan 700a blows air downwardly past the first fins 240a and the second fins 340a, and the heat dissipating efficiency of the heat dissipation device 100a is improved.

Figure 6:
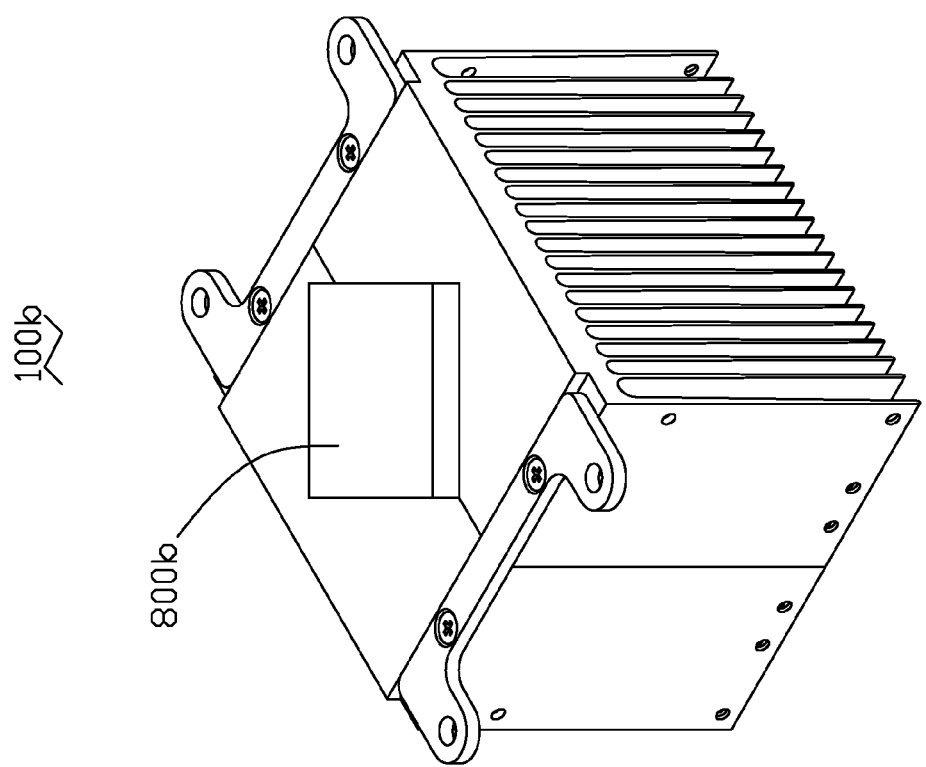
FIG. 6 is an isometric view of a heat dissipation device in accordance with a third preferred embodiment of the present invention.
Figure 7:
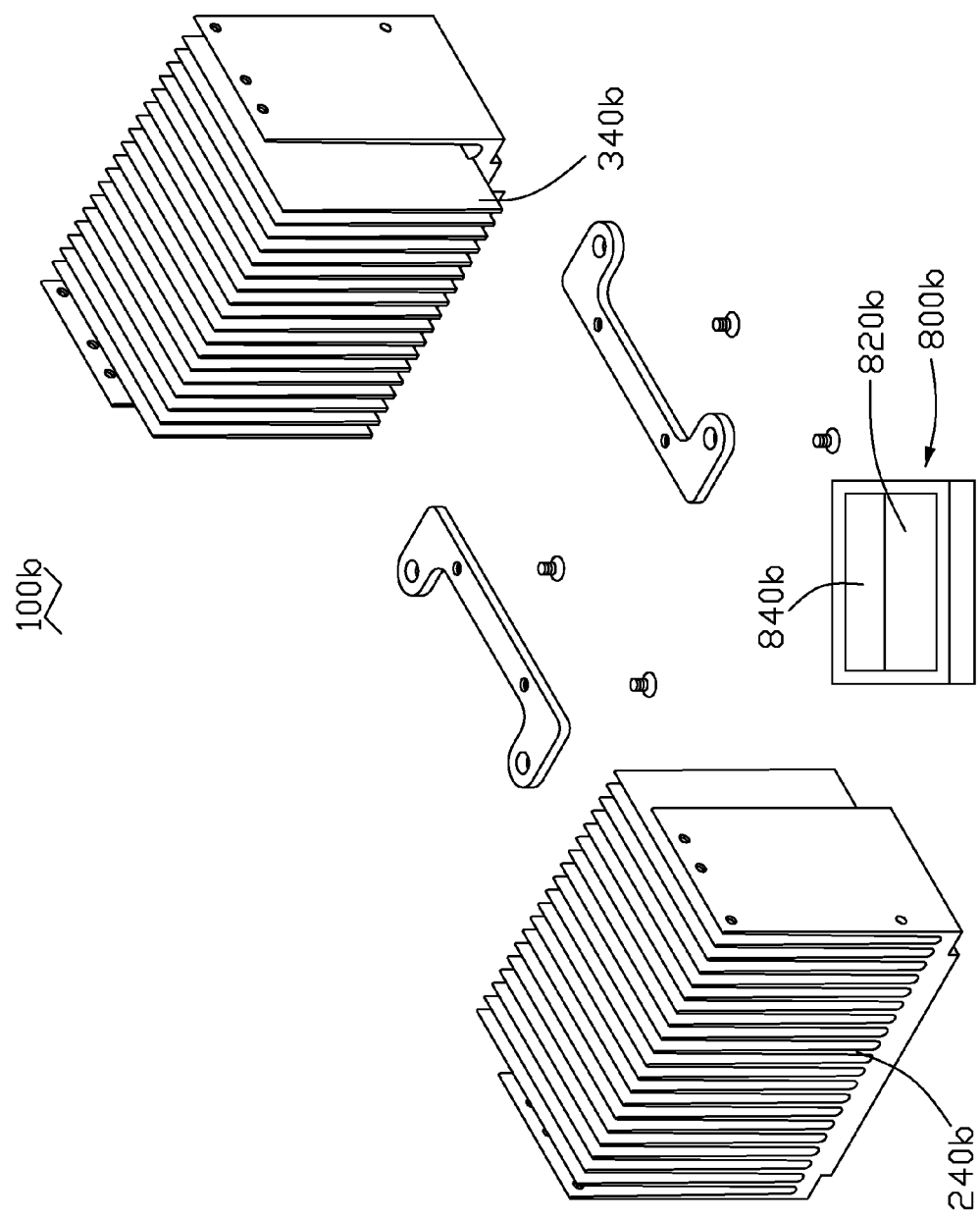
FIG. 7 is a partly exploded view of the heat dissipation device in FIG. 6 viewed from another aspect.
Figure 8:
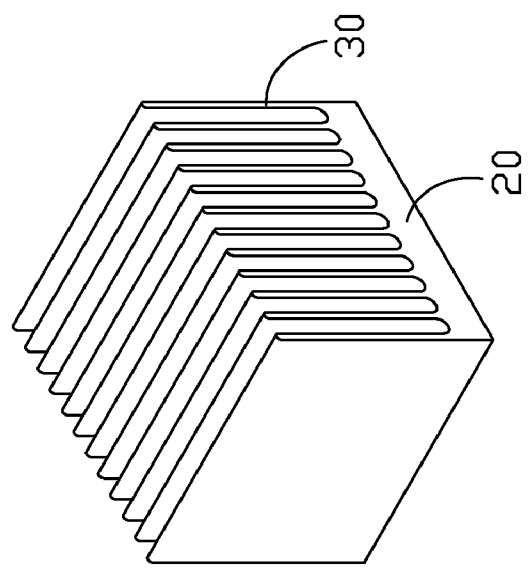
FIG. 8 is an isometric view of a heat dissipation device in accordance with related art.

For further improving the heat dissipating efficiency of the heat dissipation device, a cover 800b is provided to cover the heat absorbing block in another preferred embodiment as shown in FIGS. 6-7. The cover 800b may be made from a metal such as copper or may be formed as a vapor chamber, which has a higher heat conductivity than the heat absorbing block.

The cover 800b comprises a bottom wall 820b and a plurality of sidewalls 840b formed from edges of the bottom wall 820b. The bottom wall 820b and the sidewalls 840b together define a chamber for receiving the heat absorbing block. The chamber has a shape the same as that of the heat absorbing block. The size of the chamber is slightly smaller than that of the heat absorbing block, and the cover 800b can be covered and mounted on the heat absorbing block via press fit.

After the cover 800b has been mounted on the heat absorbing block, an outer surface of the heat absorbing block is covered by the cover 800b. The bottom wall 820b of the cover 800b abuts against a bottom surface of the heat absorbing block. The sidewalls 840b of the cover 800b abut against a periphery of the heat absorbing block. The presence of the cover 800b serves to accelerate heat transferring from the heat generating component to the heat absorbing block and the first fins 240b and the second fins 340b. This helps to further improve the heat dissipating efficiency of the heat dissipation device 100b in addition to further reinforce the heat dissipation device 100b.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
a first heat sink comprising a first base and a plurality of first fin extending from the first base, a plurality of first channels defined between the first fins; and
a second heat sink juxtaposed with the first heat sink, the second heat sink comprising a second base and a plurality of second fins extending from the second base, a plurality of second channels defined between the second fins;
wherein the second fins extend beyond a U-shaped common edge of the first base and the second base, and extend into the first channels of the first heat sink.

2. The heat dissipation device as claimed in claim 1, wherein the first fins extend beyond the common edge of the first base and the second base to extend into the second channels of the second heat sink.

3. The heat dissipation device as claimed in claim 2, wherein the first fins and the second fins are alternatively arranged.

4. The heat dissipation device as claimed in claim 3, wherein each single first fin is disposed in an associated second channel defined by neighboring two second fins of the second heat sink.

5. The heat dissipation device as claimed in claim 2, wherein the first fins extend in the second channels of the second heat sink for a distance shorter than a width of the second base along a direction from the first heat sink to the second heat sink.

6. The heat dissipation device as claimed in claim 2, further comprising a fastening member for fastening the first heat sink to the second heat sink.

7. The heat dissipation device as claimed in claim 6, wherein the fastening member comprises two clips disposed at opposite sides of the heat dissipation device, each clip comprising a body spanning across the common edge of the first base and the second base.

8. The heat dissipation device as claimed in claim 7, wherein the bodies of the clips are detachably mounted on the heat dissipation device.

9. The heat dissipation device as claimed in claim 7, wherein each clip further comprises two arms extending from opposite ends of the body, each arm defining an aperture therein for a locking member extending therethrough to secure the heat dissipation device onto a heat generating component.

10. The heat dissipation device as claimed in claim 1, further comprising two fixing members disposed at each lateral side thereof, each fixing member comprising a first plate transversely spans across the U-shaped common edge between the first heat sink and the second heat sink, and connecting the first heat sink to the second heat sink.

11. The heat dissipation device as claimed in claim 10, wherein the each fixing member further comprises a second plate extending perpendicularly from a top edge of the first plate; the heat dissipation device further comprises a fan mounted on the second plates to blow air past the first fins and the second fins.

12. The heat dissipation device as claimed in claim 1, wherein the first heat sink has a first protrusion formed at the first base adjacent to the second base; the second heat sink has a second protrusion formed at the second base adjacent to the first base, the first protrusion and the second protrusion together form a heat absorbing block for the heat dissipation device.

13. The heat dissipation device as claimed in claim 12, further comprising a cover covering the heat absorbing block.

14. The heat dissipation device as claimed in claim 13, wherein the cover is made of a metal having a heat conductivity higher than that of the heat absorbing block or formed as a vapor chamber.

15. The heat dissipation device as claimed in claim 1, wherein the first base and the second base are arranged at a same elevation.

16. The heat dissipation device as claimed in claim 1, wherein the first and second heat sinks each are formed by aluminum extrusion.

17. A heat dissipation device comprising:
a first heat sink having a first base and a plurality of first fins extending upwardly and perpendicularly from the first base, wherein the first base and the first fins are integrally formed as a monolithic piece; and
a second heat sink having a second base and a plurality of second fins extending upwardly and perpendicularly from the second base, wherein the second base and the second fins are integrally formed as a monolithic piece;
wherein the second fins each have a lateral portion extending into a channel between two corresponding first fins and the first fins each have a lateral portion extending into a channel between two corresponding second fins.

18. The heat dissipation device as claimed in claim 17, wherein the first and second heat sinks each are formed by aluminum extrusion.

19. The heat dissipation device as claimed in claim 17, wherein the first and second bases cooperatively form a heat absorbing block adapted for contacting and absorbing heat from a heat-generating electronic component.

20. The heat dissipation device as claimed in claim 17 further comprising a clip spanning across a common edge of the first base and the second base and secured to the first and second bases to thereby connect the first and second bases together.

* * * * *